United States Patent
White

(10) Patent No.: US 6,396,704 B1
(45) Date of Patent: May 28, 2002

(54) CELL BOARD EJECTOR

(75) Inventor: Joseph M White, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/918,766

(22) Filed: Jul. 30, 2001

(51) Int. Cl.[7] .............................. H05K 7/14; H01H 9/00
(52) U.S. Cl. ..................... 361/754; 361/759; 361/798; 361/801; 200/292; 200/335
(58) Field of Search ................................ 361/728, 752, 361/753, 754, 759, 796–798, 801; 439/157; 200/50.01, 50 R, 292, 318, 335; 211/41.17

(56) References Cited

U.S. PATENT DOCUMENTS

| | | | |
|---|---|---|---|
| 4,596,907 A | * | 6/1986 | LaGreco et al. ............ 200/292 |
| 4,914,550 A | * | 4/1990 | Filsinger et al. ............ 361/715 |
| 5,191,970 A | * | 3/1993 | Brockway et al. .......... 200/292 |
| 5,989,043 A | * | 11/1999 | Han et al. .................... 439/157 |

* cited by examiner

Primary Examiner—Jayprakash N. Gandhi

(57) ABSTRACT

An ejector latch mechanism is used to detachably mount a printed circuit board in a bus on the chassis of an active system. The ejector latch mechanism includes a switch component proximate an edge of the printed circuit board, and a latch pin mounted on the printed circuit board in a position that is removed from the corner and proximate the edge. A pivotable latch body is hingedly mounted to the printed circuit board for selective movement into open and closed positions. A hook is pivotally mounted to the latch body for selective engagement against the latch pin when the latch body is in the closed position. A signal provided by the switch component is used to notify the active system of pivotal movement in the latch body so that the active system can save electronic states of the printed circuit board and implement a graceful shutdown as appropriate for replacement of the printed circuit board without disruption of other system operations.

8 Claims, 4 Drawing Sheets

CELL BOARD EJECTOR

BACKGROUND OF THE INVENTION

1. Field of the Invention

The invention pertains to the field of latch mechanisms that facilitate online replacement of printed circuit board cards, and more specifically, to latch mechanisms that also function as switches that provide signals facilitating replacement of the printed circuit boards while associated electronic systems remain active.

2. Discussion of the Related Art

Computer system maintenance, repair and upgrade operations sometimes involve the insertion or replacement of printed circuit boards. Standard operating procedures for the insertion or replacement of expansion cards have traditionally required the computer system to be shut-down or powered off during the insertion or replacement procedures. This requirement is problematic because the computer system is unavailable to fulfill its intended function during the procedure. The system unavailability is not necessarily a problem in some cases; however, unavailability causes severe disruptions in other cases. For example, in the case of a telecommunications server that supports a large number of clients, even temporary unavailability of the server may cause extreme inconvenience to the client base.

One solution to the problem of having to shut down computer systems for maintenance is to provide an online or hot-swapping capability that permits the insertion and removal of expansion cards while the system is operational. For example, U.S. Pat. No. 5,568,610 teaches the use of capacitive plates coupled to corresponding variable frequency oscillators that, in combination, detect the insertion or removal of an expansion card. This solution, as well as other solutions involving closely aligned pins in the printed circuit board and the bus into which it is inserted, require that close alignments be made in order to provide a signal to the system indicating that the printed circuit board is being removed. False signals can be created by slight misalignments, and there is often insufficient time to complete a graceful shutdown of the printed circuit board if the printed circuit board is removed too quickly.

There exists a present need for a mechanically and electronically reliable latch mechanism that is capable of signaling a system during the online replacement of printed circuit boards.

SUMMARY OF THE INVENTION

The present invention overcomes the problems that are outlined above by providing an improved latch mechanism having mechanically and electronically reliable features for use in signaling a system during the online replacement of printed circuit boards.

The ejector latch mechanism may be used in detachable mounting of a printed circuit board in a bus on a chassis for an active system. The printed circuit board includes a corner, an edge forming part of the corner along a width dimension of the printed circuit board, a switch component proximate the edge, and a latch pin that is located at a position removed from the corner proximate the edge. A pivotable latch body is mounted to the printed circuit board proximate the corner through use of a hinge pin. The latch body includes a first end having cooperable structure for interacting with the switch component to signal pivotal movement of the first end. A second end of the latch body has structure for interengagement with the chassis, such as an arm extending to a greater width than does the edge of the printed circuit board, that selectively locks the latch body in a closed position against the chassis and unlocks the latch body by pivotal motion of the latch body into an open position away from the chassis. A hook is pivotally mounted to the latch body for selective engagement against the latch pin when the latch body is in the closed position.

Special aspects of the hook may optionally include a spring that biases the hook into engagement with the latch pin. The spring may be integrally formed with the hook.

The second end of the latch body may be provided with a ledge that is positioned to contact the chassis upon pivotal motion of the latch body into the open position. The ledge, by virtue of this contact against the chassis, is operable for pulling the printed circuit board out of the bus commensurate with the pivotal motion of the latch body into the open position.

In operation, the system is configured for interpreting a signal from the switch component indicating whether the cooperable structure for interacting with the switch component on the first end of the latch body is interacting with the switch component. The signal provides an indicator that the latch body is in at least one of the closed position and the open position. The system is configured for interpreting the signal from the switch component and causing a graceful shutdown of the printed circuit board commensurate with pivotal movement of the latch body into the open position. The signal changes with closure of the latch mechanism following replacement of the printed circuit board. The system interprets this signal, as appropriate, and restores the printed circuit board to an active operational state commensurate with pivotal movement of the latch body into the closed position. FIG. 5 is a midsectional view taken along line 5—5 of FIG. 2.

DETAILED DESCRIPTION OF THE PREFERRED EMBODIMENTS

Figure 1:
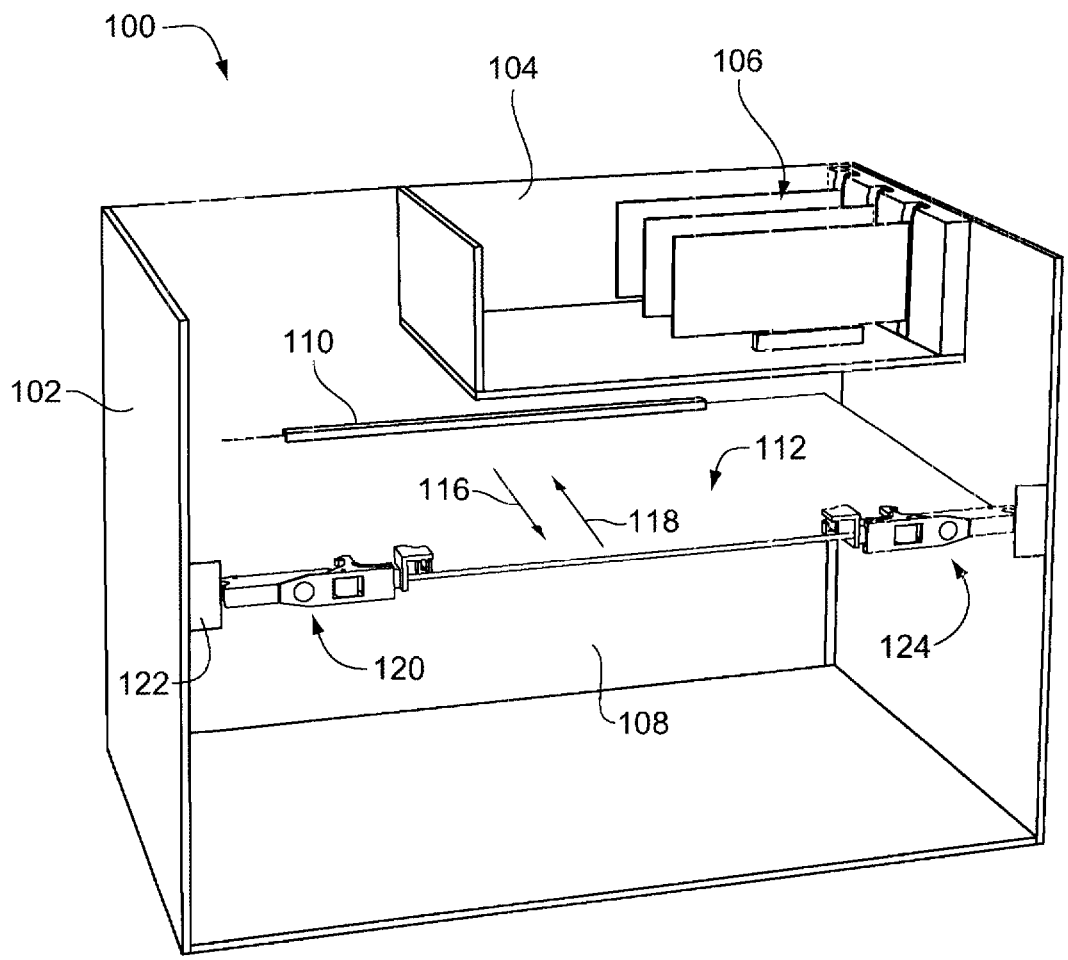
FIG. 1 is a top, side perspective view showing a telecommunications server incorporating ejector latches according to the instrumentalities described herein.

FIG. 1 depicts a telecommunications server 100 that resides in a chassis 102. The top portion of chassis 102 has been removed to reveal internal components, such as a bay 104 for a plurality of expansion cards 106. An electrical backplane 108 carries a bus 110 that is connected to a printed circuit board 112 in a conventional plug-in configuration.

An optional sliding rail assembly facilitates extensile motion in the direction of arrow 116 and de-extensile in the direction of arrow 118 of the printed circuit board 112. The extensile motion according to arrow 116 unplugs the printed circuit board from the bus 110. The full extent of deextensile motion according to arrow 118 plugs printed circuit board 112 into the bus 110.

A first ejector latch mechanism 120 engages chassis 102 to lock the printed circuit board 112 into position at the full extent of deextensile motion according to arrow 118. A corresponding latch plate 122 is optionally attached to chassis 102 for interengagement with latch mechanism 120. An optional second latch mechanism 124 is configured as a mirror image of the first latch mechanism 120.

The telecommunications server 100, which may also be any other electrical system making use of printed circuit boards, such as a computer, network server, or laboratory test instrumentation, can be operably powered during extensile and deextensile motion of printed circuit board 112 according to arrows 116 and 118.

As described in greater detail below, the ejector latch mechanisms 120 and 124 are capable of providing a signal that indicates whether the ejector latch mechanisms 120 and 124 are in an open or closed configuration. When the ejector latch mechanisms 120 and 124 are opened, the telecommunications server 100 interprets the signal to commence a graceful shutdown of operations on printed circuit board 112 by saving the operational states and disrupting power to the printed circuit board 112. When the ejector latch mechanisms 120 and 124 are closed following a replacement, the telecommunications server 100 interprets the signal to restore power to the printed circuit board 112, restore the saved states, and commence active operations on printed circuit board 112. This procedure does not necessarily require the telecommunications server 100 to be shut down in consequence of printed circuit board being removed from bus 110, and the telecommunications server 100 is optionally able to perform active operations during the interval of time when printed circuit board 112 is unplugged from bus 110.

Figure 2:
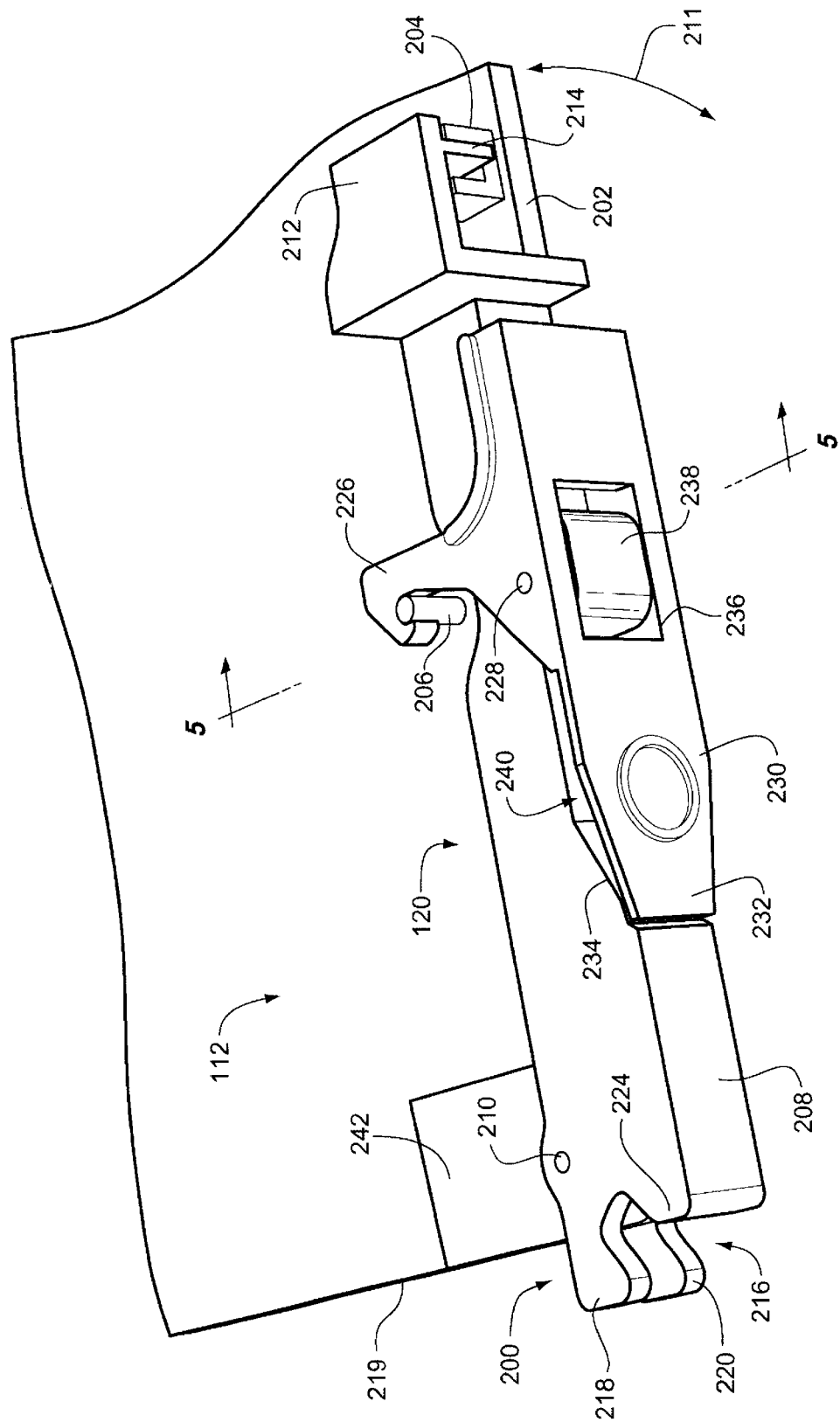
FIG. 2 is a top perspective view providing additional detail with respect to one of the ejector latch assemblies.

FIG. 2 provides additional detail with respect to the first ejector latch mechanism 120 and is a magnified view of the area shown as bubble 2 in FIG. 1. The printed circuit board 112 includes a corner 200 and an edge 202 that forms part of the corner along a width dimension "W." An optical switch component 204 is mounted on the printed circuit board 112 proximate the edge 202. A latch pin 206 is mounted on the printed circuit board 112 at a position that is removed from the corner 200 along width dimension "W" and inwardly depthwise proximate the edge 202.

A pivotable latch body 208 is mounted to the printed circuit board 112 along edge 202 through use of a hinge pin 210. A first end 212 of the latch body 208 has an optical interrupt arm 214 for a cooperable interaction with the optical switch component 204 to signal pivotal movement of the first end along arc 211 by the present or absence of the optical interrupt arm 214 within the optical switch component 204. A second end 216 of the latch body 208 has a cantilever arm 218 extending to a greater width dimension than does the edge 219 of the printed circuit board. A slot 220 accepts chassis 102 and latch plate 122 (see FIG. 1 and FIG. 4) for locking engagement therewith.

FIG. 2 shows the first ejector latch mechanism 120 in a closed or locked position. Manipulation of the assembly followed by pivoting motion of the first end 212 forwardly along arc 211 reconfigures the first ejector latch mechanism 120 into an open or unlocked position. A ledge 224 is positioned behind cantilever arm 218 for contacting the chassis 102 upon pivotal motion of the latch body 208 into the open position. As is described in greater detail below, this contact provides sufficient leverage to remove, with minimal force, the printed circuit board 112 from bus 110.

Figure 5:
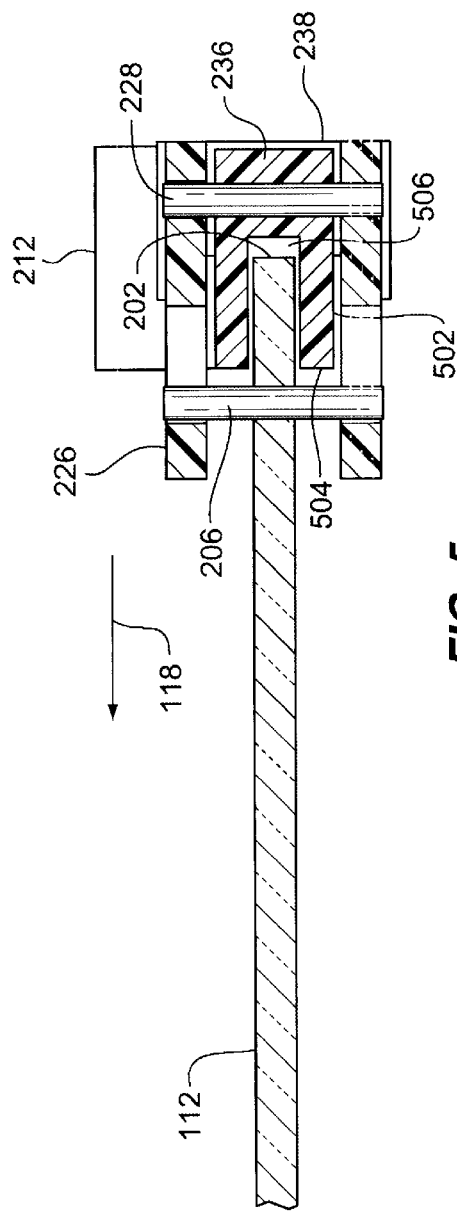
FIG. 5 is a sectional view of the ejector latch assembly taken along line 5—5 of FIG. 2.

A hook 226 is pivotally mounted to the latch body 208 through the use of a shaft 228 extending through both the hook 228 and the latch body 208 (as shown in FIG. 1 and FIG. 5). The hook 226 selectively engages the latch pin 206 when the latch body is in the closed position, as shown in FIG. 2. An optional compression leaf spring 230 is integrally formed with the hook 226. A tail 232 of leaf spring 230 contacts ramp 234 formed in latch body 208. Compressional forces exerted by tail 232 on ramp 234 are carried by shaft 228 and hook 226. These forces drive hook 226 towards and, preferably, onto latch pin 206. A rectangular opening 236 is provided to permit passage of a rocker stud 238 formed in latch body 208 so that the hook 226 may pivot about shaft 228 due to inward flexion of leaf spring 230 into a space 240 between the leaf spring 230 and latch body 208. A reinforcing panel 242 may be bonded to printed circuit board 112 in the vicinity of hinge pin 210.

FIG. 5 is a midsectional view taken along line 5–5 of FIG. 2. The latch body 208 includes an upper section 500 and a lower section 502, which are separated to form a gap 504. The printed circuit board 112 substantially fills gap 504, except for a forward area 506, which permits movement of latch body 208 in the direction of arrow 118 relative to printed circuit board 112.

Figure 3:
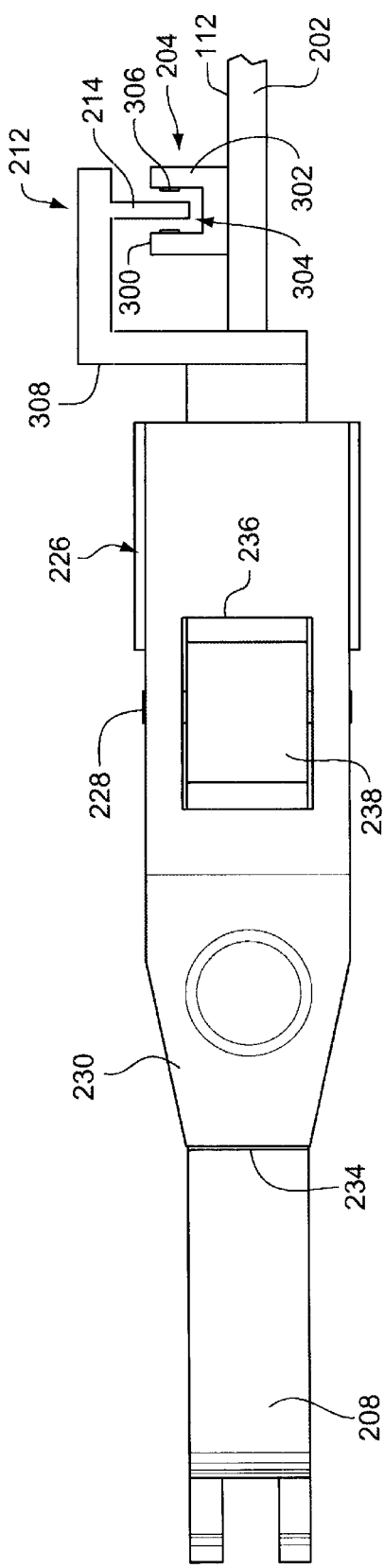
FIG. 3 is a front plan view of the ejector latch assembly.

FIG. 3 depicts a front plan view of the first ejector latch mechanism 120. FIG. 3 shows an especially preferred form of the optical switch component 204, which comprises a first leg 300 and a second leg 302 defining a slot 304. Leg 302 contains a light emitting diode (LED) 306 (or alternatively a laser diode) that emits light across slot 304 from leg 302 to leg 300. Leg 300 contains a corresponding photosensor (not shown) that is able to detect light from diode 302 when slot 304 is unimpeded by interrupt arm 214.

As shown in FIG. 3, the interrupt arm 214 on first end 212 of latch body 208 resides in slot 304 at a position that disrupts or blocks the transmission of light from leg 302 to leg 300. The interrupt arm 214 is able to move through slot 304 commensurate with pivoting motion of latch body 208. Removal of interrupt arm 214 from slot 304 permits the transmission of light from diode 302 across slot 304 to leg 300.

Beginning from the closed position shown in FIG. 1, exertion of force 408 moves surface 412 slightly forward to position 415 in deextensile motion following arrow 118. This motion also moves hook 226 forward sufficiently to clear tip 415 from latch pin 206. Simultaneous exertion of force 418 on leaf spring 230 causes flexion in leaf spring 230 that forms arc 420 into space 240. This flexion pivots hook 226 on shaft 228, which also rotates tip 415 in the direction of arrow 416 a sufficient distance to clear latch pin 206 upon outrotation 400 of latch body 208.

Figure 4:
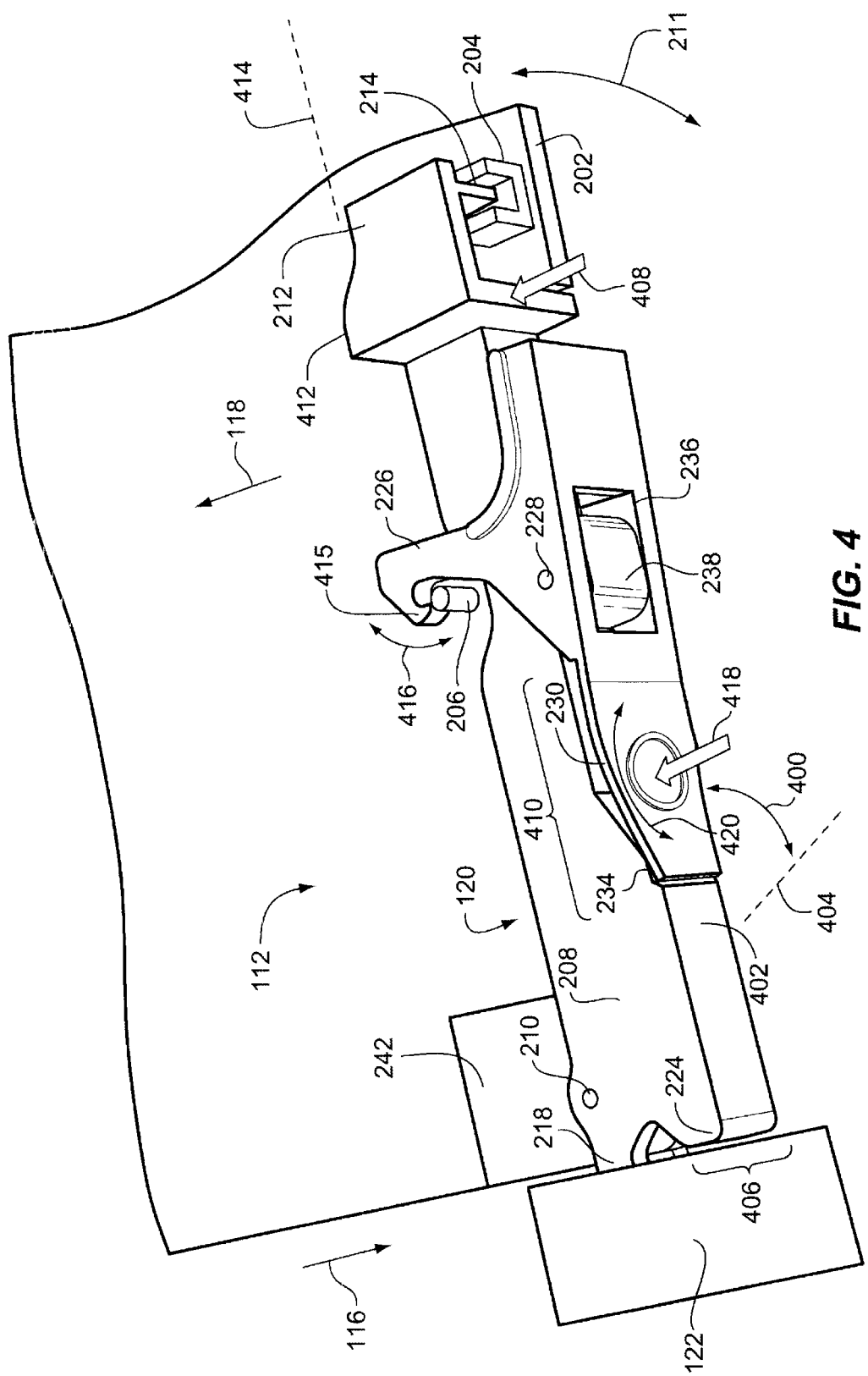
FIG. 4 is a top perspective view demonstrating component movements of the ejector latch assembly.

FIG. 4 depicts the first ejector latch mechanism 120 in progress through a sequence of movements following the disengagement of pin 206 by hook 226 (as described above) that ultimately result in outrotation 400 of latch body 208 such that face 402 is aligned with position 404. The outrotation 400 drives ledge 224 into engagement with surface 406 on latch plate 122. The force exerted by this contact is transferred to the printed circuit board 120 through hinge pin 210 and, if the second latch mechanism 124 is also opened, results in deextensile motion of the printed circuit board in the direction of arrow 116 for a sufficient distance to disengage the printed circuit board from bus 110 (see FIG. 1). The latch body 208 may then be used as a handle to fully remover printed circuit board 112 from chassis 102.

Reversal of the foregoing movements during insertion of the printed circuit board 112 permits cantilever arm 218 to slowly exert controlled force against latch plate 122 during closure for full insertion of printed circuit board into bus 110. This controlled force is magnified in application by the mechanical advantage obtained by exerting force 408 across section 410 using hinge pin 210 as a fulcrum point.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

What is claimed is:

1. An ejector latch mechanism for use in detachable mounting of a printed circuit board in a bus on a chassis of an active system, comprising:

a printed circuit board including a corner, an edge forming part of the corner along a width dimension of the printed circuit board, a switch component proximate the edge, and a latch pin removed from the corner proximate the edge;

a pivotable latch body including a first end having cooperable structure for interacting with the switch component to signal pivotal movement of the first end;

a second end having structure for interengaging with the chassis to selectively lock the latch body in a closed position against the chassis and unlock the latch body by pivotal motion of the latch body into an open position away from the chassis;

a hinge pin pivotally coupling the latch body to the printed circuit board proximate the second end; and a hook pivotally mounted to the latch body for selective engagement against the latch pin when the latch body is in the closed position.

2. The ejector latch mechanism of claim 1, comprising a spring biasing the hook into engagement with the latch pin.

3. The ejector latch mechanism of claim 1, wherein the spring is integrally formed with the hook.

4. The ejector latch mechanism of claim 1, wherein the structure for interengaging with the chassis comprises an arm extending to a greater width than does the edge of the printed circuit board.

5. The ejector latch mechanism of claim 4, wherein the second end of the latch body comprises a ledge positioned to contact the chassis upon pivotal motion of the latch body into the open position, the ledge, by virtue of this contact against the chassis, being operable for pulling the printed circuit board out of the bus commensurate with the pivotal motion of the latch body into the open position.

6. The ejector latch mechanism of claim 1, comprising a system configured for interpreting a signal from the switch component indicating whether the cooperable structure for interacting with the switch component on the first end of the latch body is interacting with the switch component, this signal providing an indicator whether the latch body is in at least one of the closed position and the open position.

7. The ejector latch mechanism of claim 6, comprising the system configured for interpreting the signal from the switch component and causing a graceful shutdown of the printed circuit board commensurate with pivotal movement of the latch body into the open position.

8. The ejector latch mechanism of claim 6, comprising circuitry for receiving the signal and restoring the printed circuit board to an active operational state commensurate with pivotal movement of the latch body into the closed position.

\* \* \* \* \*